(12) United States Patent
Neporada et al.

(10) Patent No.: US 10,216,740 B2
(45) Date of Patent: Feb. 26, 2019

(54) SYSTEM AND METHOD FOR FAST PARALLEL DATA PROCESSING IN DISTRIBUTED STORAGE SYSTEMS

(71) Applicant: Acronis International GmbH, Schaffhausen (CH)

(72) Inventors: Andrei Neporada, Dolgoprudny (RU); Vladimir Simonov, Moscow (RU); Stanislav Protasov, Moscow (RU); Mark Smulevich, Moscow (RU); Serguei Beloussov, Singapore (SG)

(73) Assignee: ACRONIS INTERNATIONAL GMBH, Schaffhausen (CH)

( * ) Notice: Subject to any disclaimer, the term of this patent is extended or adjusted under 35 U.S.C. 154(b) by 394 days.

(21) Appl. No.: 15/086,891

(22) Filed: Mar. 31, 2016

(65) Prior Publication Data

US 2017/0286436 A1    Oct. 5, 2017

(51) Int. Cl.
| | |
|---|---|
| *G06F 17/00* | (2006.01) |
| *G06F 17/30* | (2006.01) |
| *G06F 3/06* | (2006.01) |
| *H03M 13/15* | (2006.01) |

(52) U.S. Cl.
CPC ........ *G06F 17/30073* (2013.01); *G06F 3/064* (2013.01); *G06F 3/067* (2013.01); *G06F 3/0619* (2013.01); *G06F 3/0643* (2013.01); *G06F 3/0644* (2013.01); *G06F 17/30138* (2013.01); *G06F 17/30194* (2013.01); *G06F 17/30584* (2013.01); *H03M 13/154* (2013.01)

(58) Field of Classification Search
CPC ...... G06F 3/067; G06F 3/0608; G06F 3/0619; G06F 3/0647; G06F 9/5077; G06F 3/0604
IPC ....................................................... G06F 17/00
See application file for complete search history.

(56) References Cited

U.S. PATENT DOCUMENTS

2013/0041872 A1*   2/2013   Aizman ............ G06F 17/30194
707/690

* cited by examiner

*Primary Examiner* — Truong V Vo
(74) *Attorney, Agent, or Firm* — Arent Fox LLP; Michael Fainberg

(57) ABSTRACT

A system and method is disclosed for fast parallel data processing in a distributed storage system. An example method includes receiving at least one digital object; determining, by a processor of a computing device, whether the at least one digital object has a fixed data block structure; in response to determining that the at least one digital object has a fixed data block structure, determining by the processor a size of each fixed data block of the at least one digital object; determining a number of archive chunks for storing the at least one digital object on a selected plurality of storage servers based at least upon the size of each fixed data block; and partitioning the at least one digital object into the number of archive chunks for storing on the selected plurality of storage servers using erasure coding.

17 Claims, 6 Drawing Sheets

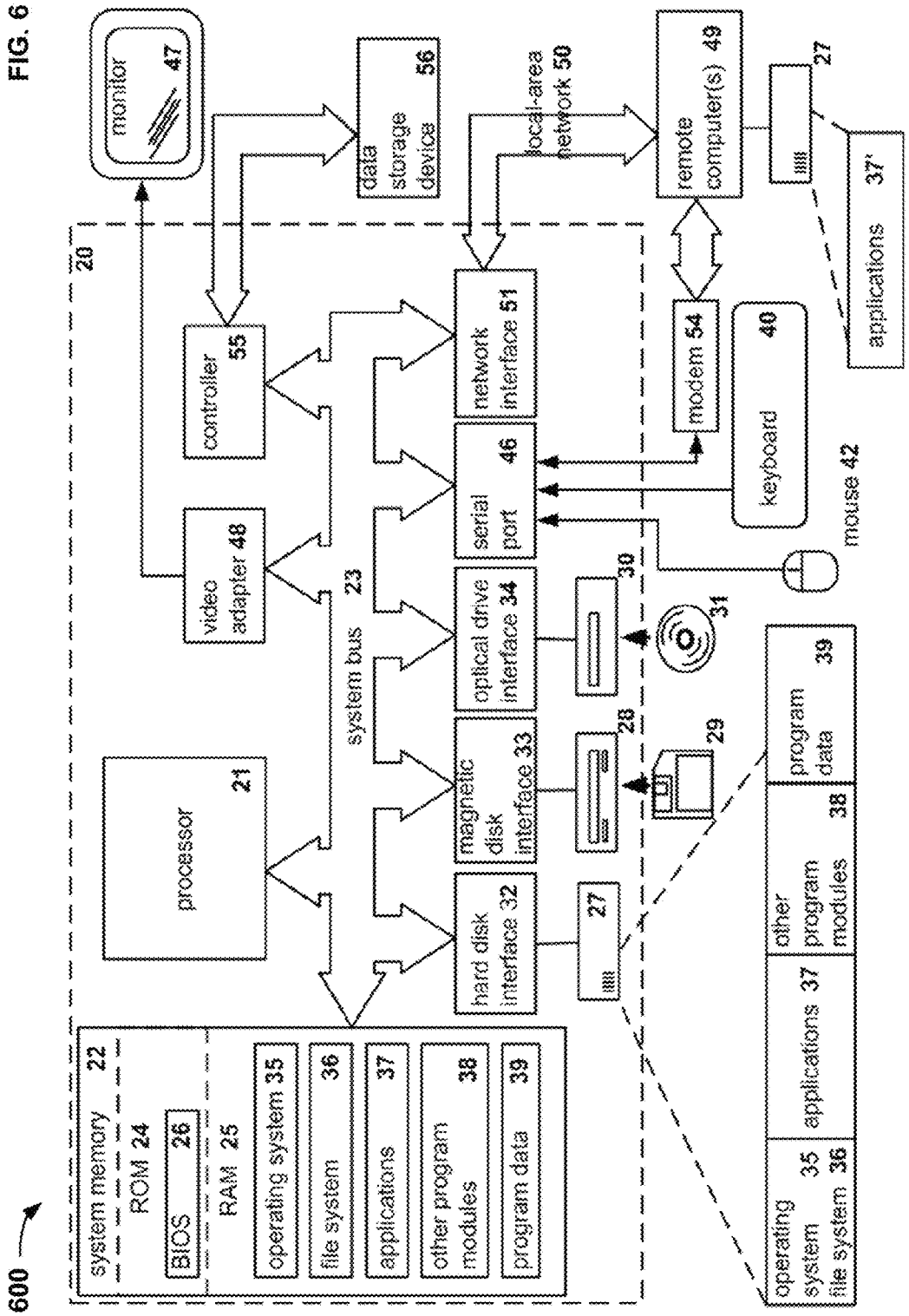

SYSTEM AND METHOD FOR FAST PARALLEL DATA PROCESSING IN DISTRIBUTED STORAGE SYSTEMS

FIELD OF TECHNOLOGY

The present disclosure generally relates to the field of parallel data processing for big data, and, more specifically, to a system and method for fast parallel data processing in distributed storage systems where data have a regular structure.

BACKGROUND

Hadoop is a distributed processing platform that allows data-intensive operations to be processed in a distributed fashion. A Hadoop cluster commonly includes a master node and a group of worker nodes, such that a job request may be divided into a plurality of tasks, and the tasks may be distributed to a group of worker nodes within the Hadoop platform to be processed in parallel. Hadoop Distributed File System (HDFS) is a widely-used distributed file system that is designed to be highly fault tolerant, be deployed on inexpensive hardware, store large scale data sets, and stream those data sets at high bandwidth to user applications. A HDFS cluster includes a NameNode and a configurable number of DataNodes. The NameNode is a central server responsible for managing the NameSpace, which is a hierarchy of files and directories that clients access. A DataNode cluster is a server that stores and manages which is responsible for managing storage of the node where it resides.

Traditionally, using a solution for processing massive volumes of data like the combination of Hadoop and HDFS, data may be stored as replicas including one original part and two copies, which may require up to 200% overhead. One thus needs 3 TB memory space to store 1 TB of data, that is, 1 TB for original data and 2 TB for two replicas. Each replica may be stored on its own node or a separate server. When such data need to be processed, the Hadoop may locate the fastest node or server by response and perform necessary data processing using that node or server, thereby avoiding data transfers among difference entities via a network and the data processing undertaken is directed to the data. In handling big data workloads, however, Hadoop and HDFS may present themselves as a very high-overhead application because this solution is designed to utilize excess CPU capacity to conserve disk and network bandwidth.

Moreover, a common term one may hear in the context of Hadoop is "Schema-on-Read" which refers to the fact that raw, unprocessed data may be loaded into Hadoop, with the structure imposed at processing time based on the requirements of a processing application. Despite this powerful feature in handling raw data, there are a number of file formats and compression formats supported on Hadoop, and each may have particular strengths that make it better suited to specific applications. Additionally, although Hadoop provides the HDFS for storing data, there are several commonly used systems implemented on top of HDFS, such as HBase for additional data access functionality and Hive for additional data management functionality. Data format compatibility with these system would also affect system performance. As such, there are still important considerations to take into account with respect to the structure of data stored in distributed storage systems.

Accordingly, there is a need for a system and method for fast parallel data processing in distributed storage systems where data have a regular structure.

SUMMARY

The present disclosure provides an effective solution for the foregoing problems by providing example systems, methods and computer readable media for fast parallel data processing in distributed storage systems where data have a regular structure.

In one aspect, an exemplary method is disclosed for fast parallel data processing in distributed storage systems. The exemplary method is implemented by a processor of a computing device by: receiving at least one digital object; determining whether the at least one digital object has a fixed data block structure; in response to determining that the at least one digital object has a fixed data block structure, determining a size of each fixed data block of the at least one digital object; determining a number of archive chunks for storing the at least one digital object on a selected plurality of storage servers based at least upon the size of each fixed data block; and partitioning the at least one digital object into the number of archive chunks for storing on the selected plurality of storage servers using erasure coding.

In another aspect, the method includes adjusting parameters of the erasure coding for the selected plurality of storage servers based on a criticality of data stored thereon.

In another aspect, the method includes, in response to detecting that the at least one digital object comprises two or more files or records having different sizes, determining that the at least one digital object has an irregular structure.

In another aspect, the number of archive chunks may be a multiple of the size of each fixed data block.

In another aspect, the method includes, in response to determining that the at least one digital object has the fixed data block structure, analyzing an application generating the at least one digital object to determine the size of each fixed data block; and partitioning the at least one digital object into a plurality of parts based on the size of each fixed data block while keeping the at least one digital object logically intact.

In another aspect, the method includes, in response to receiving a data processing request relating to the at least one digital object, retrieving the number of archive chunks from the selected plurality of storage servers for forming the at least one digital object.

In another aspect, adjusting the parameters of the erasure coding may be carried out by adjusting at least the number of archive chunks for storing the at least one digital object on the selected plurality of storage servers to achieve a selected overhead.

In another aspect, a distributed storage system is disclosed for fast parallel data processing. According to the exemplary aspect, the system includes an electronic memory; and a hardware processor couple to the electronic memory and configured to: receive at least one digital object; determine whether the at least one digital object has a fixed data block structure; in response to determining that the at least one digital object has a fixed data block structure, determine a size of each fixed data block of the at least one digital object; determine a number of archive chunks for storing the at least one digital object on a selected plurality of storage servers based at least upon the size of each fixed data block; and partition the at least one digital object into the number of archive chunks for storing on the selected plurality of storage servers using erasure coding.

In another aspect, a non-transitory computer readable medium storing computer executable instructions for fast parallel data processing in distributed storage systems, the instructions being configured for: receiving at least one digital object; determining whether the at least one digital object has a fixed data block structure; in response to determining that the at least one digital object has a fixed data block structure, determining a size of each fixed data block of the at least one digital object; determining a number of archive chunks for storing the at least one digital object on a selected plurality of storage servers based at least upon the size of each fixed data block; and partitioning the at least one digital object into the number of archive chunks for storing on the selected plurality of storage servers using erasure coding.

The above simplified summary of example aspects serves to provide a basic understanding of the present disclosure. This summary is not an extensive overview of all contemplated aspects, and is intended to neither identify key or critical elements of all aspects nor delineate the scope of any or all aspects of the present disclosure. Its sole purpose is to present one or more aspects in a simplified form as a prelude to the more detailed description of the disclosure that follows. To the accomplishment of the foregoing, the one or more aspects of the present disclosure include the features described and exemplary pointed out in the claims.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

FIG. 6 illustrates an example computer system on which the disclosed systems and method can be implemented.

DETAILED DESCRIPTION

Figure 1:
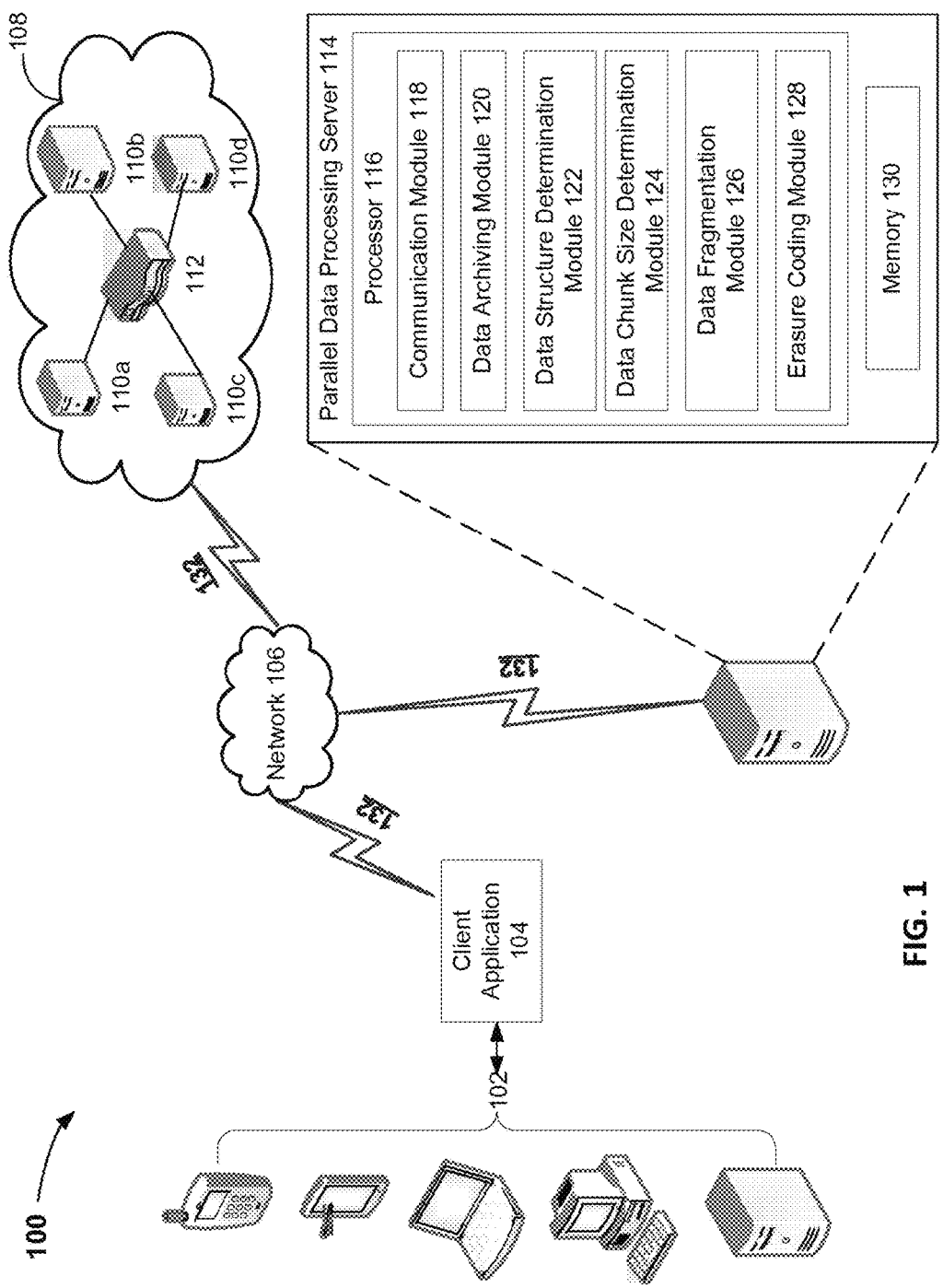
FIG. 1 illustrates a distributed storage system for fast parallel processing of data having a regular structure according to an exemplary aspect.

Disclosed herein are exemplary aspects of systems, methods and computer program products for fast parallel data processing in distributed storage systems where data have a regular structure. Various aspects of invention will be described with reference to the drawings, wherein like reference numerals are used to refer to like elements throughout. In the following description, for purposes of explanation, numerous specific details are set forth in order to promote a thorough understanding of one or more aspects of the invention. It may be evident in some or all instances, however, that any aspects described below can be practiced without adopting the specific design details described below. In other instances, well-known structures and devices are shown in block diagram form in order to facilitate description of one or more aspects of the invention.

FIG. 1 illustrates a distributed storage system 100 for fast parallel processing of data having a regular structure according to an exemplary aspect of the invention. As shown, a computing device 102, which is generally a hardware and software based computing device, may have a client application 104 installed thereon for exchanging various digital objects with one or more local or remote computing devices. A digital object here refers to any type of information represented in digital form. For instance, a digital object may be an electronic representation of information such as a computer file, a group of files, a group of file identifiers, or a collections of data or database information. Such collection of data may include frames or clips from digital audio or video streams, digital photographs, scanned documents, voice messages, streams from message records or files, log entries from audits or status logs of systems, e-mail archives, etc. As will be explained fully below according to FIG. 6, the computing device 102 may be one of personal computers, servers, laptops, tables, mobile devices, smart phones, cellular devices, portable gaming devices, media players or any other suitable devices that can retain, manipulate and transfer digital objects.

It is to be appreciated that the distributed storage system 100 may include any suitable and/or necessary interface components (not shown), which provide various adapters, connectors, channels, communication paths, to facilitate exchanging signals and data between various hardware and software components of the computing device 102 and any applications, peer devices, remote or local server systems/service providers, additional database system(s), and/or with one another that are available on or connected via an underlying network 106 and associated communication channels and protocols 132 (e.g., Internet, wireless, LAN, cellular, Wi-Fi, WAN).

According to the exemplary aspects disclosed herein, the computing device 102 may be configured to use the client application 104 to, e.g., search and/or retrieve data stored in any of computer nodes/servers of a storage cluster 108. Such a storage cluster 108 may include any number of computer nodes/servers, and each node includes a CPU (or multiple CPUs), an operating system, communication links to the other nodes (via at least a central router 112), and any number of internal hard disk drives or solid-state drives (i.e., from zero to N), often referred to as volumes. Each node may also include at least one drive and there may be any combination of hard disk drives along with solid-state drives. The storage cluster 108 may be a fixed-content cluster for backups, long-term storage, archiving, etc., and may or may not be used for day-to-day access to computer files. If implemented as a WORM (write once, read many) storage, once a computer file or digital object is written to the cluster 108, it may not be changed. However, the file may be deleted and a modified version of the computer file may also be stored within the cluster 108. Further, the storage cluster 108 may be implemented as a redundant array of independent nodes (a RAIN) where each node 110a-d may run its own operating system and make independent decisions regarding data storage operations within the storage cluster 108. Alternatively, a multi-core processor within a single computer may support a virtual storage node running on each core, such that the storage cluster 108 may have multiple nodes present within the single computer. Further, a computer system inside a single computer/node may include multiple CPUs and each CPU may represent a node such that the storage cluster 108 may be implemented within the single computer/node. In one aspect, the storage cluster 108 may be further logically or physically divided into sub-clusters. For example, nodes 110a and 110b may be considered one sub-cluster, while nodes 110c and 110d may be considered a second sub-cluster. Division of a cluster into sub-clusters may be advantageous where one sub-cluster is located in a different geographic location from another sub-cluster.

Figure 2:
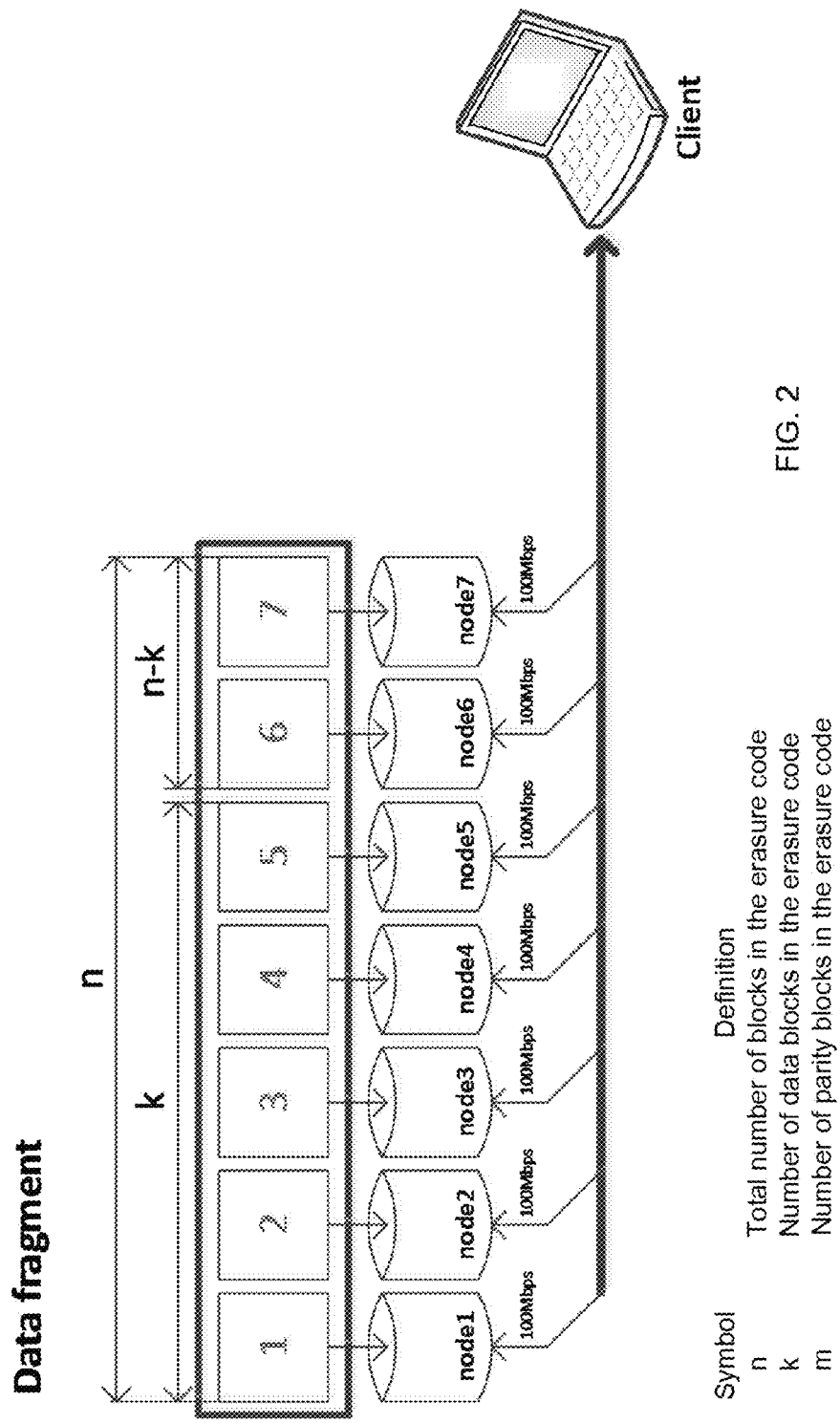
FIG. 2 is a distributed storage system for fast parallel processing of data based on erasure coding according to an exemplary aspect.
Figure 3:
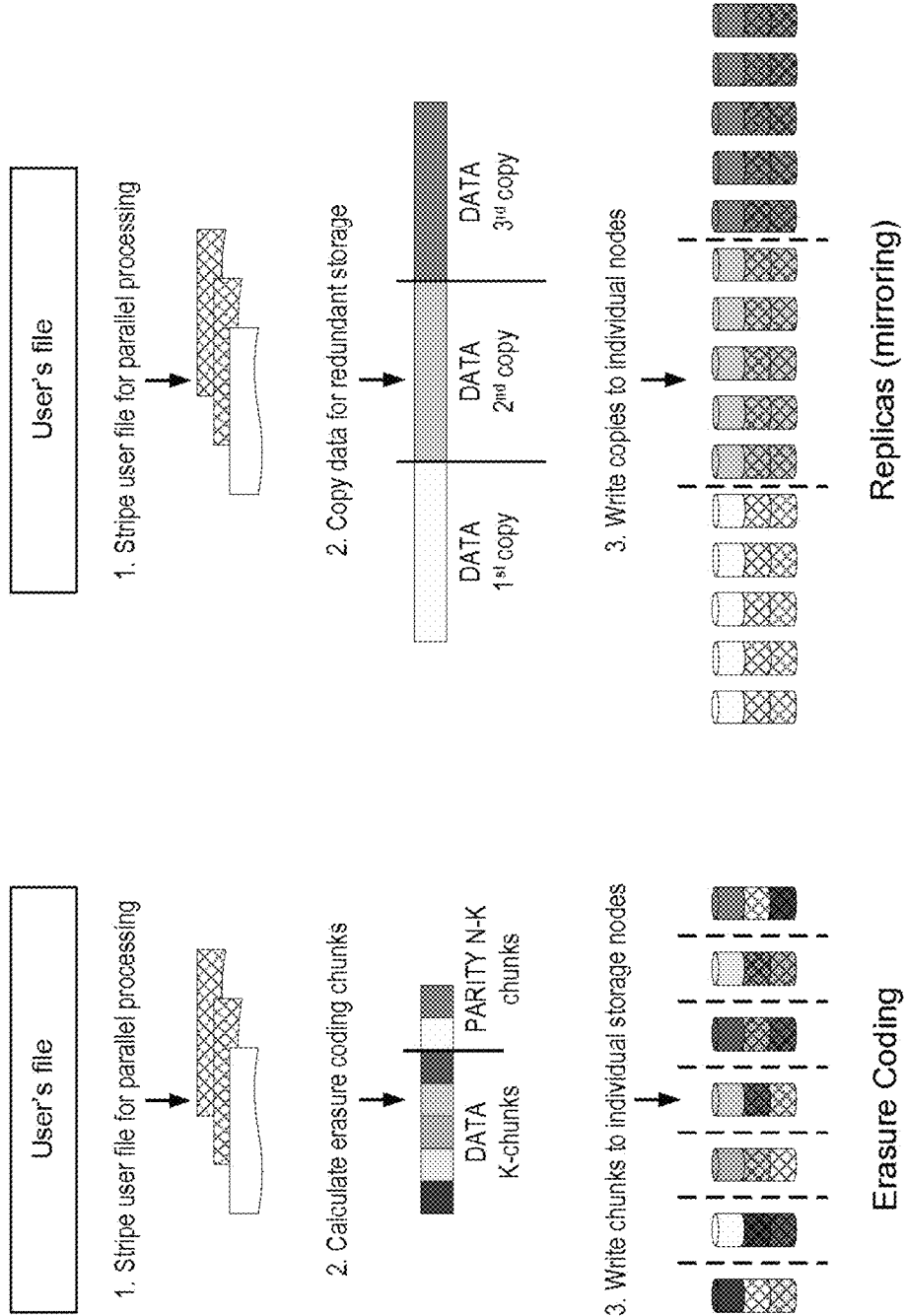
FIG. 3 is a comparison between data redundancy procuring approaches in distributed storage systems based on erasure coding scheme and replicas according to an exemplary aspect.

According to the exemplary aspect, the distributed storage system 100 may be deployed and implemented based on erasure coding to support fast parallel data processing using corresponding storage computers/nodes, as an alternative to HDFS used with Hadoop discussed previously. Generally, fault-tolerance refers to the capacity for a system to continue operating in the event of one or more failures of at least one system component. Fault-tolerance techniques typically include data replication and erasure coding. As shown in FIGS. 2 and 3, using error correction algorithms that function to recover from failures of stored data, erasure coding provides storage space efficient redundancy to data to protect against data loss events. For example, instead of replicating a stream of data as shown on the right column in FIG. 3, the data may be divided into blocks and associated with one or more parities and then the blocks are stored with the ability to reconstruct missing blocks from remaining blocks. As such, erasure coding provides cost savings in hardware, data storage footprint, and power savings from not having to provide the additional hardware.

More importantly, erasure coding is a technique for providing redundancy of a data object without the overhead of replication. Referring to FIG. 2, given a particular data object, erasure coding breaks the object into k data blocks and from those data blocks generates m parity blocks in an erasure set, commonly indicated as a k:m erasure code, where m is the difference between the total number of blocks and the number of data blocks in the erasure code. For example, when a data object is partitioned into 5 blocks which are then used to generate 2 parity blocks, a 5:7 erasure code has been employed. A key property of erasure codes is that the original object may be reconstructed from any k blocks, whether a block of an erasure-coded object is an original data block or one of the parity blocks. Accordingly, it is advantageous to distribute each block to different volumes within the storage cluster 108 and to different nodes 110a-110d, thus protecting the data object against the loss of any two volumes within the cluster 108. Given adequate nodes in the cluster 108, data blocks are distributed to different nodes, providing protection against node loss as well. If nodes are located in different geographic regions, data blocks may be distributed among the regions to protect, to the extent possible, against loss of the portion of a cluster in one geographic locale.

Referring to FIG. 3, the simplest form of protective data redundancy may be data replication as shown on the right column, with one or more additional copies of an original object being created and maintained to be available. As discussed previously, using the Hadoop and HDFS, data may be stored as replicas including one original part and two copies, which may require up to 200% overhead. As such, one needs 3 TB memory space to store 1 TB of data, that is, 1 TB for original data and 2 TB for two replicas. As will be explained fully below, the distributed storage system 100 disclosed herein uses erasure coding scheme to achieve a remarkable storage efficiency, at least because it only requires 40% overhead. For example, one needs 1.4 TB storage space for storing 1 TB of data with similar level of reliability as classic replica-based storage solutions, in particular for data having a regular structure.

Figure 4:
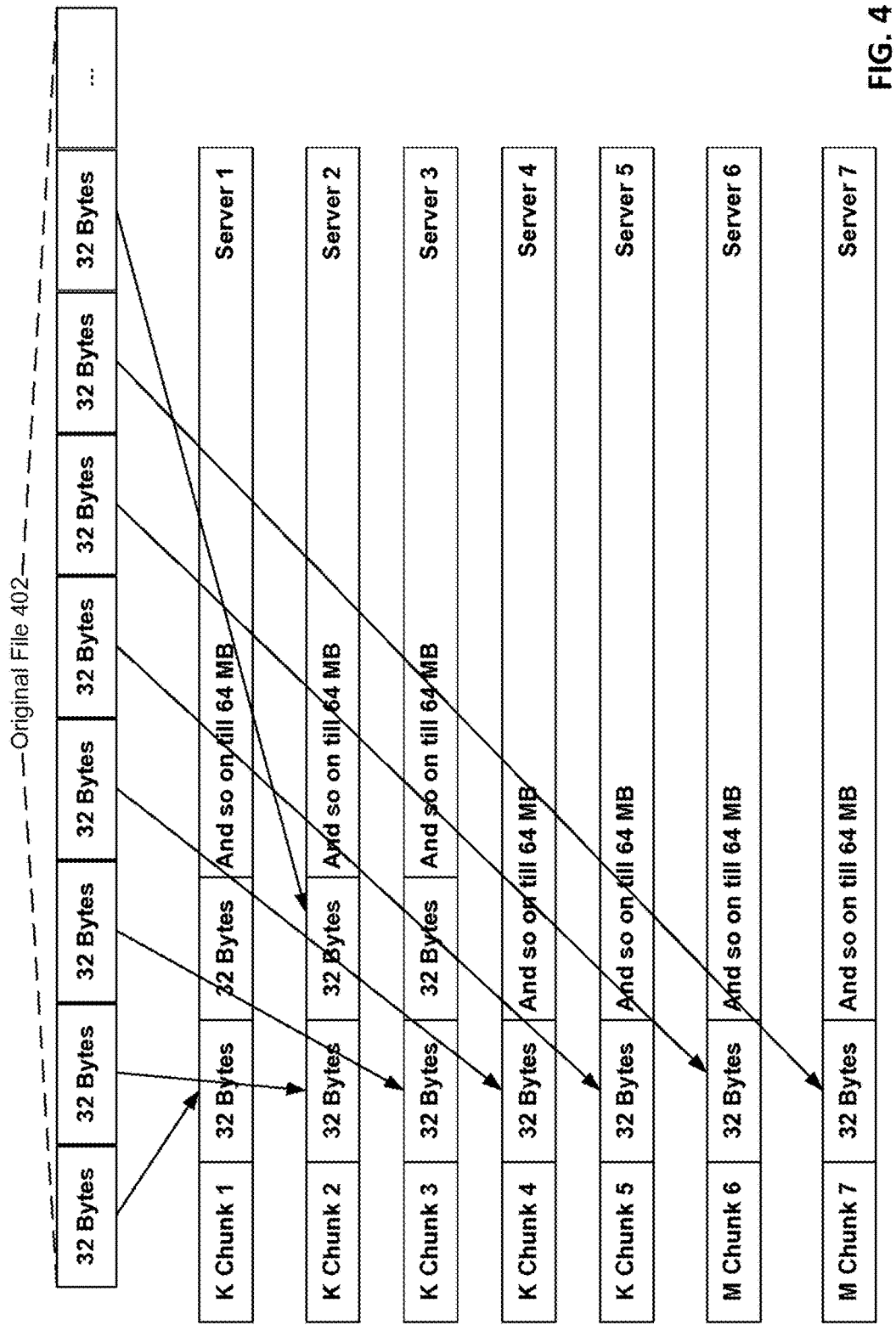
FIG. 4 illustrates an example original data object partition process in connection with application requirements according to an exemplary aspect.

It is known in the art that there are a number of applications configured to write or generate digital files in fixed data portions, such as the plurality of 32 bytes portions of an original file 402 illustrated in FIG. 4. It is to be appreciated that such fixed data portion may be customized or configured for each individual user and it could be 4 KB or 22 bytes or any other suitable data size. For example, such types of data with fixed data portions may be routinely employed by communications service providers (CSPs) and mobile operators etc. Typically, these users store their data as database records, each with fixed size, and they have millions and billions such records which need to be archived and stored for backup purposes.

According to some exemplary aspects, referring back to FIG. 1, a parallel data processing server 114 may be implemented in the distributed storage system 100 to facilitate the computing device 102 to, e.g., search data stored in the storage cluster 108 for certain pieces of information among massive volumes of data or perform a data extraction with high speed, preferably when such data have a regular structure. Among other features, the parallel data processing server 114 may comprise at least one processor 110 controlling and executing a plurality of modules such as a communication module 118, a data archiving module 120, a data structure determination module 122, a data chunk size determination module 124, a data fragmentation module 126, and an erasure coding module 128. Via various I/O components (not shown), the processor 116 may be coupled to memory 130 which includes computer storage media in the form of volatile and/or nonvolatile memory for executing machine executable instructions stored thereon. The memory 130 may be removable, non-removable, or a combination thereof. It is to be appreciated that the server 114 may be deployed outside the storage cluster 108 as an independent entity, or reside within and be associated with the storage cluster 108 or another storage cluster. As an example, as shown in FIG. 1, the server 114 may be linked to the storage cluster 108 to obtain access to each node 110a-100d over any suitable network connection 106 and 132. Alternatively, the server 114 may be deployed within the storage cluster 108 to view and administer the entire cluster. In certain implementations, nodes 110a-110d and the server 114 may be considered equal and communicate with one another by periodically broadcasting or multicasting their relevant information to all other nodes within the cluster 108.

Using a communication module 118, the parallel data processing server 114 may be configured to handle external requests from, e.g., the client application 104 of the computing device 102, data processing requests among nodes 110a-110d or other computing devices, other internode protocol communications (synchronization, handshaking, requests for information, etc.), and exchanging data with a variety of devices. According to some exemplary aspects of the present invention, in response to receiving a digital object from an external apparatus for archival in the storage cluster 108 via the communication module 118, a data archiving module 120 of the server 114 may be configured to move this digital object to one or more selected nodes 110a-110d for long term retention while providing retrieval of the object whenever required. Traditionally, data archiving may involve moving data to a cheaper secondary storage, such as tapes and optical disks, but retrieval of the data can be expensive and cumbersome due to the fact that queries cannot be readily performed on archival systems and the data have to be first retrieved into the secondary storage for processing. In dealing with Big Data technology emphasizing volume, velocity and variety for a wide array of data processing tasks, it is necessary for user or enterprises to have a strong archival solution that can both store enormous amounts of data quickly and scale to meet particular usage requirements with minimum efforts. In some aspect, the data archiving module 120 of the server 114 may first perform specific metrics analysis to differentiate between active and inactive data based on, e.g., past usage pattern in terms of access frequency and time, and classify the received digital object into a class selected from immediately useful to historical. Moving the digital object into the storage cluster 108 may employ encryption and masking to ensure the security and maximize throughput of the system by compressing data associated with the digital object when necessary. Transforming the original data structure of the digital object into some other form (e.g., a normalized form to reduce redundancy) may also be implemented. On the other hand, maintaining the original data structure of the digital object may allow one to perform a full data set query across archived data in the storage cluster 108 and active data of an enterprise data warehouse from where the digital object originates.

Subsequently, the processor 116 may be configured to instantiate and execute a data structure determination module 122 to determine the data structure of the digital object. As discussed previously, certain digital files may be generated in fixed data portions, such as the plurality of 32 bytes portions of the file 402 depicted in FIG. 4. Detection of such fixed, regular data structure of a file may be carried out based on a file extension, specific data fields of the file, unique keys or identifiers, foreign keys associated with the file. If the digital object is determined to have an irregular structure such as different sizes and lengths of its associated files and records, a standard data archiving process may be performed. By contrast, in response to ascertaining that the received digital object has a regular structure indicating at least a plurality of sequential fixed data portions, compressed or uncompressed, the data structure determination module 122 may determine the size of the digital object and the number of the data portions (e.g., the number of data blocks). Moreover, the data structure determination module 122 may be advantageously configured to analyze the application generating the particular digital object with a regular structure and detect the size of the fixed data portion accordingly, such that the original digital object is untouched logically, but partition into original "application-generated" parts. These parts will form data chunks that will be distributed and stored across the storage cluster 108 while avoiding expensive data parts transfer to one or more single servers where these data parts will be combined into the original file and processed by analytics. That is, under this approach, analytics with these data parts of the original file may be performed without the necessity to build the file itself, as these data parts are obtained directly from the servers where they stored. As the parallelism of data processing may be measured by data processing speed, the higher k parameter (the number of data blocks), the higher degree of parallelism or speed in data processing. In addition, a much better storage efficiency (40% vs. 200% overhead) is achieved.

Thereafter, the processor 116 may be configured to execute a data chunk size determination module 124 to define the size of archive chunks for the digital object to be used with a plurality selected nodes 110a-110d in the storage cluster 108. In an exemplary aspect, such an archive chunk size may be a multiple of the size of the data blocks of the digital object. For example, if a data block size of the digital object is 512 bytes, archive chunks may be 1 Mb (2000 times of 512 bytes), or 512 Kb (1000 times), or any other suitable size depending upon the storage capacity of the storage cluster 108. That is, taking into account the throughput and bandwidth of the storage cluster 108, all or a portion of the storage nodes 110a-110d may be selected for further processing the digital object in connection with a dynamically adjustable archive chunk size for optimal parallel data processing performance.

Next, the original digital object may be partitioned into the plurality of archive chunks by a data fragmentation module 126, and ultimately saved on each individual selected storage nodes 110a-110d using erasure coding technique described above by an erasure coding module 128. In accordance with an exemplary aspect, depending upon the criticality of the data (e.g., frequently accessed data), the erasure coding module 128 may adjust k/n parameters for the selected storage nodes 110a-110d. As a result, in response to receiving one or more data processing requests such as searching, partial data extraction, or any report relating to the digital object now stored in the storage cluster 108 may be initiated with the maximum speed (high parallelism), as there is no need to complete data restoration from archive for these data processing tasks.

Figure 5:
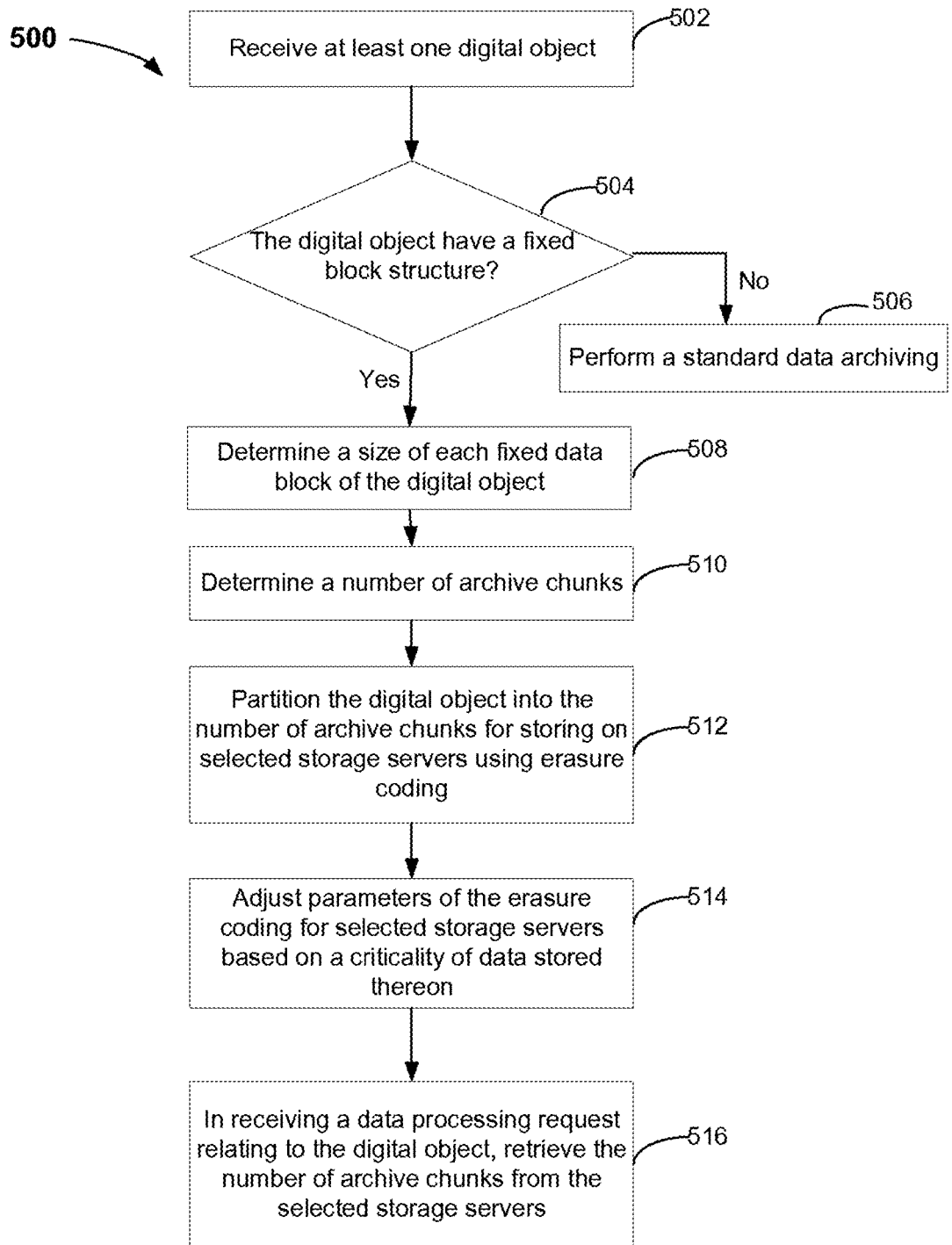
FIG. 5 illustrates a method for fast parallel data processing in a distributed storage system where data having a regular structure according to an exemplary aspect.

FIG. 5 illustrates a method 500 for fast parallel data processing in a distributed storage system, in particular, where data have a regular structure, according to exemplary aspects of the present invention. Initially at Step 502, the method comprises receiving at least one digital object by, e.g., the parallel data processing server 114 of FIG. 1 for archiving in the storage cluster 108. Next, at Step 504, the method comprises determining, by a processor of the parallel data processing server 114, whether the at least one digital object has a fixed data block structure. Upon detecting files or records associated with the digital objects having various sizes and lengths, that is, the digital object has an irregular structure, at Step 506, the method 500 comprises performing a standard data archiving for the digital object in the storage cluster 108. On the other hand, in response to determining that the digital object has a fixed data block structure, at Steps 508 and 510, the method 500 comprises determining, by the parallel data processing server 114, a size of each fixed data block of the digital object, and a number of archive chunks for storing the digital object on a selected plurality of storage servers (e.g., nodes 110a-110d in FIG. 1) based at least upon the size of each fixed data block. Here, the number of archive chunks may be a multiple of the size of each fixed data block. In another aspect, if the digital object is determined to have a fixed data block structure, the method 500 comprises analyzing an application generating the digital object in order to determine the size of each fixed data block; and partitioning the at least one digital object into a plurality of parts based on the size of each fixed data block while keeping the at least one digital object logically intact. Continuing on to Step 512, the method 500 comprises partitioning the digital object into the number of archive chunks for storing on the selected plurality of storage servers using erasure coding described above.

After the digital object being distributed and stored across the storage cluster 108, the method 500 further comprises adjusting parameters of the erasure coding for the selected plurality of storage servers based on a criticality of data stored thereon. For example, at least the number of archive chunks may be adjusted for the selected plurality of storage servers to achieve a desired storage overhead with respect to CPU and/or memory usage of nodes 110a-110d. It is to be appreciated that other parameters of an erasure code profile may also be adjusted for improving overall system performance such as the data chunk size, and/or the number of coding chunks m.

FIG. 6 illustrates an example computer system (which may be the computing device 102 or any of the servers 110a-d, 114 in FIG. 1) on which the disclosed systems and method can be implemented according to an example aspect. It should be appreciated that the detailed computer system can correspond to the physical machine 102 and the memory 106 as described above with respect to FIG. 1. Moreover, the processor 21 of computer 20 can be configured to execute each of the backup software 104 including the backup application 114, the volume tracker module 116, the virtual restoring engine 118, and the dedicated boot loader 120.

As shown in FIG. 6, the computer system 20 includes the processor or central processing unit 21, a system memory 22 and a system bus 23 connecting the various system components, including the memory associated with the central processing unit 21. The system bus 23 is realized like any bus structure known from the prior art, including in turn a bus memory or bus memory controller, a peripheral bus and a local bus, which is able to interact with any other bus architecture. The system memory includes read only memory (ROM) 24 and random-access memory (RAM) 25. The basic input/output system (BIOS) 26 includes the basic procedures ensuring the transfer of information between elements of the personal computer 20, such as those at the time of loading the operating system with the use of the ROM 24.

The personal computer 20, in turn, includes a hard disk 27 for reading and writing of data, a magnetic disk drive 28 for reading and writing on removable magnetic disks 29 and an optical drive 30 for reading and writing on removable optical disks 31, such as CD-ROM, DVD-ROM and other optical information media. The hard disk 27, the magnetic disk drive 28, and the optical drive 30 are connected to the system bus 23 across the hard disk interface 32, the magnetic disk interface 33 and the optical drive interface 34, respectively. The drives and the corresponding computer information media are power-independent modules for storage of computer instructions, data structures, program modules and other data of the personal computer 20.

The present disclosure provides the implementation of a system that uses a hard disk 27, a removable magnetic disk 29 and a removable optical disk 31, but it should be understood that it is possible to employ other types of computer information media 56 which are able to store data in a form readable by a computer (solid state drives, flash memory cards, digital disks, random-access memory (RAM) and so on), which are connected to the system bus 23 via the controller 55.

The computer 20 has a file system 36, where the recorded operating system 35 is kept, and also additional program applications 37, other program modules 38 and program data 39. The user is able to enter commands and information into the personal computer 20 by using input devices (keyboard 40, mouse 42). Other input devices (not shown) can be used: microphone, joystick, game controller, scanner, and so on. Such input devices usually plug into the computer system 20 through a serial port 46, which in turn is connected to the system bus, but they can be connected in other ways, for example, with the aid of a parallel port, a game port or a universal serial bus (USB). A monitor 47 or other type of display device is also connected to the system bus 23 across an interface, such as a video adapter 48. In addition to the monitor 47, the personal computer can be equipped with other peripheral output devices (not shown), such as loudspeakers, a printer, and so on.

The personal computer 20 is able to operate within a network environment, using a network connection to one or more remote computers 49. The remote computer (or computers) 49 are also personal computers or servers having the majority or all of the aforementioned elements in describing the nature of a personal computer 20. Other devices can also be present in the computer network, such as routers, network stations, peer devices or other network nodes.

Network connections can form a local-area computer network (LAN) 50, such as a wired and/or wireless network, and a wide-area computer network (WAN). Such networks are used in corporate computer networks and internal company networks, and they generally have access to the Internet. In LAN or WAN networks, the personal computer 20 is connected to the local-area network 50 across a network adapter or network interface 51. When networks are used, the personal computer 20 can employ a modem 54 or other modules for providing communications with a wide-area computer network such as the Internet. The modem 54, which is an internal or external device, is connected to the system bus 23 by a serial port 46. It should be noted that the network connections are only examples and need not depict the exact configuration of the network, i.e., in reality there are other ways of establishing a connection of one computer to another by technical communication modules, such as Bluetooth.

In various aspects, the systems and methods described herein may be implemented in hardware, software, firmware, or any combination thereof. If implemented in software, the methods may be stored as one or more instructions or code on a non-transitory computer-readable medium. Computer-readable medium includes data storage. By way of example, and not limitation, such computer-readable medium can comprise RAM, ROM, EEPROM, CD-ROM, Flash memory or other types of electric, magnetic, or optical storage medium, or any other medium that can be used to carry or store desired program code in the form of instructions or data structures and that can be accessed by a processor of a general purpose computer.

In various aspects, the systems and methods described in the present disclosure in terms of modules. The term "module" as used herein refers to a real-world device, component, or arrangement of components implemented using hardware, such as by an application specific integrated circuit (ASIC) or field-programmable gate array (FPGA), for example, or as a combination of hardware and software, such as by a microprocessor system and a set of instructions to implement the module's functionality, which (while being executed) transform the microprocessor system into a special-purpose device. A module can also be implemented as a combination of the two, with certain functions facilitated by hardware alone, and other functions facilitated by a combination of hardware and software. In certain implementations, at least a portion, and in some cases, all, of a module can be executed on the processor of a general purpose computer (such as the one described in greater detail in FIG. 6 above). Accordingly, each module can be realized in a variety of suitable configurations, and should not be limited to any example implementation exemplified herein.

In the interest of clarity, not all of the routine features of the aspects are disclosed herein. It will be appreciated that in the development of any actual implementation of the present disclosure, numerous implementation-specific decisions must be made in order to achieve the developer's specific goals, and that these specific goals will vary for different implementations and different developers. It will be appreciated that such a development effort might be complex and time-consuming, but would nevertheless be a routine undertaking of engineering for those of ordinary skill in the art having the benefit of this disclosure.

Furthermore, it is to be understood that the phraseology or terminology used herein is for the purpose of description and not of restriction, such that the terminology or phraseology of the present specification is to be interpreted by the skilled in the art in light of the teachings and guidance presented herein, in combination with the knowledge of the skilled in the relevant art(s). Moreover, it is not intended for any term in the specification or claims to be ascribed an uncommon or special meaning unless explicitly set forth as such.

The various aspects disclosed herein encompass present and future known equivalents to the known modules referred to herein by way of illustration. Moreover, while aspects and applications have been shown and described, it would be apparent to those skilled in the art having the benefit of this disclosure that many more modifications than mentioned above are possible without departing from the inventive concepts disclosed herein.

What is claimed is:

1. A method for fast parallel data processing in a distributed storage system, the method comprising:
   receiving at least one digital object;
   determining, by a processor of a computing device, whether the at least one digital object has a fixed data block structure;
   in response to determining that the at least one digital object has a fixed data block structure, determining by the processor a size of each fixed data block of the at least one digital object;
   determining a number of archive chunks for storing the at least one digital object on a selected plurality of storage servers based at least upon the size of each fixed data block;
   adjusting parameters of erasure coding for the selected plurality of storage servers based on a criticality of data stored thereon; and
   partitioning the at least one digital object into the number of archive chunks for storing on the selected plurality of storage servers using the erasure coding.

2. The method of claim 1, further comprising:
   in response to detecting that the at least one digital object comprises two or more files or records having different sizes, determining that the at least one digital object has an irregular structure.

3. The method of claim 1, wherein the number of archive chunks is a multiple of the size of each fixed data block.

4. The method of claim 1, further comprising:
   in response to determining that the at least one digital object has the fixed data block structure, analyzing an application generating the at least one digital object to determine the size of each fixed data block; and
   partitioning the at least one digital object into a plurality of parts based on the size of each fixed data block while keeping the at least one digital object logically intact.

5. The method of claim 1, further comprising:
   in response to receiving a data processing request relating to the at least one digital object, retrieving the number of archive chunks from the selected plurality of storage servers for forming the at least one digital object.

6. The method of claim 1, wherein adjusting the parameters of the erasure coding comprises adjusting at least the number of archive chunks for storing the at least one digital object on the selected plurality of storage servers to achieve a selected overhead.

7. A distributed storage system for fast parallel data processing, the system comprising:
   an electronic memory; and
   a hardware processor couple to the electronic memory and configured to:
      receive at least one digital object;
      determine whether the at least one digital object has a fixed data block structure;
      in response to determining that the at least one digital object has a fixed data block structure, determine a size of each fixed data block of the at least one digital object;
      determine a number of archive chunks for storing the at least one digital object on a selected plurality of storage servers based at least upon the size of each fixed data block;
      adjust parameters of erasure coding for the selected plurality of storage servers based on a criticality of data stored thereon; and
      partition the at least one digital object into the number of archive chunks for storing on the selected plurality of storage servers using the erasure coding.

8. The system of claim 7, wherein the number of archive chunks is a multiple of the size of each fixed data block.

9. The system of claim 7, wherein the processor is further configured to:
   in response to determining that the at least one digital object has the fixed data block structure, analyze an application generating the at least one digital object to determine the size of each fixed data block; and
   partition the at least one digital object into a plurality of parts based on the size of each fixed data block while keeping the at least one digital object logically intact.

10. The system of claim 7, wherein the processor is further configured to, in response to receiving a data processing request relating to the at least one digital object, retrieve the number of archive chunks from the selected plurality of storage servers for forming the at least one digital object.

11. The system of claim 7, wherein the processor is further configured to restore a plurality of sectors of the computing device based on a priority determined based at least upon a usage frequency of each sector.

12. The system of claim 7, wherein, to adjust the parameters of the erasure coding, the processor is further configured to adjust at least the number of archive chunks for storing the at least one digital object on the selected plurality of storage servers to achieve a selected overhead.

13. A non-transitory computer readable medium storing computer executable instructions for fast parallel data processing in a distributed storage system, the instructions being configured for:
   receiving at least one digital object;
   determining, by a processor of a computing device, whether the at least one digital object has a fixed data block structure;
   in response to determining that the at least one digital object has a fixed data block structure, determining by the processor a size of each fixed data block of the at least one digital object;

determining a number of archive chunks for storing the at least one digital object on a selected plurality of storage servers based at least upon the size of each fixed data block;

adjusting parameters of erasure coding for the selected plurality of storage servers based on a criticality of data stored thereon; and partitioning the at least one digital object into the number of archive chunks for storing on the selected plurality of storage servers using the erasure coding.

14. The non-transitory computer readable medium of claim 13, further comprising instructions for:

adjusting at least the number of archive chunks for storing the at least one digital object on the selected plurality of storage servers to achieve a selected overhead.

15. The non-transitory computer readable medium of claim 13, further comprising instructions for, in response to detecting that the at least one digital object comprises two or more files or records having different sizes, determining that the at least one digital object has an irregular structure.

16. The non-transitory computer readable medium of claim 13, wherein the number of archive chunks is a multiple of the size of each fixed data block.

17. The non-transitory computer readable medium of claim 13, further comprising instructions for, in response to receiving a data processing request relating to the at least one digital object, retrieving the number of archive chunks from the selected plurality of storage servers for forming the at least one digital object.

\* \* \* \* \*